United States Patent [19]

Hofer

[11] Patent Number: 4,614,914

[45] Date of Patent: Sep. 30, 1986

[54] LOW-DISTORTION TRANSFORMER-COUPLED CIRCUIT

[75] Inventor: Bruce E. Hofer, Beaverton, Oreg.

[73] Assignee: Audio Precision, Inc., Beaverton, Oreg.

[21] Appl. No.: 722,812

[22] Filed: Apr. 12, 1985

[51] Int. Cl.[4] ............................................... H03F 1/26
[52] U.S. Cl. ..................................... 330/149; 330/195
[58] Field of Search ................... 330/96, 97, 109, 149, 330/195; 333/213, 217

[56] References Cited

U.S. PATENT DOCUMENTS 4,453,131  6/1984  Paullus ................................. 330/196

Primary Examiner—James B. Mullins
Assistant Examiner—G. Wan
Attorney, Agent, or Firm—William A. Birdwell

[57] ABSTRACT

A low-distortion transformer-coupled circuit. An amplifier is constructed to have a negative output impedance equal to the resistance of the primary winding of a coupling transformer to which the amplifier is connected thereby cancelling the distortion component produced by the transformer distortion current flowing through the primary winding resistance. The input to the amplifier is thus coupled to the secondary winding of the transformer. A low-frequency feedback circuit is provided between the amplifier output and a non-inverting input thereof. Means is provided for adjusting the negative output impedance of the amplifier to match circuit parameters. Alternatively, the coupling transformer employs two matched primary windings and one secondary winding, and the amplifier is constructed to provide a signal to each primary winding.

13 Claims, 6 Drawing Figures

LOW-DISTORTION TRANSFORMER-COUPLED CIRCUIT

BACKGROUND OF THE INVENTION

This invention relates to transformer coupled circuits, in particular to circuits for reducing the distortion introduced by the non-linearity of a magnetic core transformer employed in coupling a drive circuit to a driven circuit.

In coupling one circuit, a drive circuit, to another circuit, a driven circuit, it is often desirable to employ a magnetic core coupling transformer. Such coupling transformers are used, for example, to isolate the drive circuit from the driven circuit, particularly to avoid the common mode problems that would introduce unwanted noise, and in order to match the impedance of the drive circuit to the impedance of the driven circuit. A significant problem with the use of coupling transformers in audio frequency circuits is that the magnetic core of an audio transformer introduces some non-linearity due to the inherent magnetic characteristics of the core material, which is typically iron or an iron-nickel alloy. As a practical matter this cannot be avoided by eliminating the magnetic core because the magnetic core is needed to provide adequate coupling in a transformer of practical size. While transformer design technology allows audio transformers to be built that will introduce low levels of distortion at low amplitude levels, they are not adequate for many high-quality audio circuit applications where very low distortion of higher amplitude signals is needed, for example, test and measurement instrumentation.

Aside from improving the quality of coupling transformers, the principal approach to reducing the afore-described difficulty has been to detect a portion of the distortion signal produced by the transformer and provide that as negative feedback to an amplifier driving a transformer. This has been done, for example, by feeding back a portion of the signal generated at the secondary winding of the transformer. However, this solution eliminates the isolation advantage of the coupling transformer. The feedback approach has also been implemented by providing the coupling transformer with an additional winding which produces a signal representative of the distortion, and feeding that signal back to an amplifier driving the transformer primary. To avoid both DC overload and drive amplifier instability in such a circuit, a low-frequency negative feedback path separate from the distortion signal negative feedback path has been provided. Examples of the foregoing can be found in Paullus U.S. Pat. No. 4,453,131, issued June 5, 1984.

However, a problem with any feedback approach is that its effectiveness is limited by the actual gain of the drive amplifier. Since a real amplifier cannot have infinite gain, a feedback approach cannot totally eliminate the transformer distortion. The use of an additional feedback winding on the transformer also has the problems that it introduces inherent phase delay which limits the effectiveness of the transformer at high frequencies, and of course requires a special transformer.

It is known that, in concept, the distortion introduced in a coupling transformer can be explained as a voltage drop produced by the flow of distortion current generated by the magnetic core of the transformer through the resistance of the primary winding of the coupling transformer and the source impedance of the circuit driving the transformer. Thus, if the winding resistance did not exist and the source impedance could be ignored, there would be no distortion produced. It is also generally known that active circuits can be made to exhibit negative impedance. It would be desirable if such a circuit could be utilized to, in effect, cancel the resistance of the primary winding of a coupling transformer and thereby eliminate transformer-produced distortion.

SUMMARY OF THE INVENTION

The present invention provides a transformer coupled circuit wherein transformer-produced distortion is virtually eliminated by the use of a negative impedance generator circuit. In the invention an amplifier is adapted to couple a drive circuit to a primary winding of a coupling transformer having a secondary winding for connection to a driven circuit. The amplifier detects distortion current in the primary winding as a voltage produced across an impedance placed in series with the primary winding and produces a voltage that compensates for the voltage drop produced by the flow of distortion current through the resistance of the primary winding. Put another way, the amplifier is constructed so as to provide a negative output impedance equal to the winding resistance of the transformer. This results in total elimination of transformer distortion over a predetermined frequency range, except for variances in component tolerances, and permits total isolation between the drive circuit and the circuit driven by the secondary winding of the transformer.

Since in the situation where the output impedance of the amplifier exactly cancels the input resistance of the transformer the DC output of the amplifier would be indeterminate, which would render the circuit inoperative, the circuit is provided with a low frequency feedback path for providing DC stability.

The circuit is also provided with a resistance network for adjusting the amount of negative impedance to accommodate variations in circuit parameters.

While the invention may be used with a coupling transformer of standard design, preferably a transformer having dual matched primary windings would be employed, both windings being driven by the amplifier, to reduce degradation in the high frequency response of the coupling circuit due to stray capacitance of the transformer windings.

In order to minimize the effect of circuit changes due to temperature, the distortion current detection impedance may be made so as to have a similar temperature coefficient to the primary windings of the transformer.

Accordingly, it is a principal objective of the present invention to produce a novel circuit for coupling a drive circuit through a transformer to a driven circuit.

It is another objective of the present invention to provide such a circuit in which distortion produced by the non-linearity of the coupling transformer is virtually eliminated.

It is a further objective of the present invention to provide such a circuit in which variations in circuit parameters may be accommodated.

It is yet another objective of the present invention to provide such a circuit which compensates for temperature-produced variations in the winding resistance of the coupling transformer.

The foregoing and other objectives, features, and advantages of the invention will be more readily under-

DETAILED DESCRIPTION OF THE INVENTION

Figure 1:
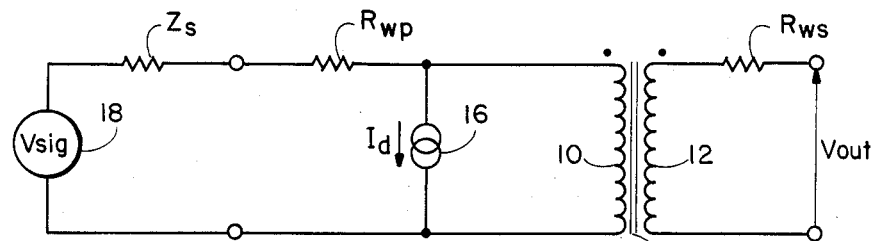
FIG. 1 shows a schematic diagram of a model of a magnetic core coupling transformer connected to a drive circuit.

Referring first to FIG. 1, it can be seen that a real magnetic core transformer may be represented schematically by a primary winding 10, a secondary winding 12, and a magnetic core 14 typically, though not necessarily, made of iron. This transformer model also includes a resistor $R_{ws}$, which represents the resistance of the secondary winding 12, a resistor $R_{wp}$, which represents the resistance of the primary winding 10, and a current generator 16, which generates a current $I_d$, representative of distortion current produced by the transformer in response to the application of a signal voltage to the primary winding. FIG. 1 also shows a drive circuit having a voltage generator 18 producing a voltage $V_{sig}$ and a source impedance $Z_s$. It can be shown that the output voltage $V_{out}$, as a function of time, may be represented by the following equation:

Equation 1

$$V_{out}(t) = V_{sig}(t) - (Z_s + R_{wp}) I_d(t)$$

where:

$V_{sig}(t)$ = the drive signal voltage $V_{sig}$ as a function of time;

$V_{out}(t)$ = the output voltage $V_{out}$ as a function of time; and $I_d(t)$ = the distortion current $I_d$ as a function of time, which is a non-linear function of the voltage across the primary winding 10.

In this equation it has been assumed that the inductive reactance of the primary winding 10 is sufficiently large that it may be ignored. This has been found to be the case for frequencies ranging above 10 Hz. At frequencies less than about 10 Hz the inductive reactance of the primary winding does, however, introduce some significant phase shift between the voltage applied to the primary winding 10 and the distortion current $I_d$. It has also been assumed that the primary-to-secondary transformer winding ratio is 1:1, and that $Z_s$ is purely resistive, though it is to be recognized that the principles of the invention would apply even if $Z_s$ had a reactive component.

From Equation 1 it can be seen that the output $V_{out}$ of the transformer will include, in addition to a component representing the source signal $V_{sig}$, a distortion component which is a function of the distortion current $I_d$, the primary winding resistance $R_{wp}$, and the drive circuit source impedance $Z_s$. Applicant's invention effectively eliminates the distortion component by applying a voltage to the transformer that, in addition to including the undistorted signal component, also includes a component that cancels the distortion-current produced voltage drop across $R_{wp}$.

Figure 2:
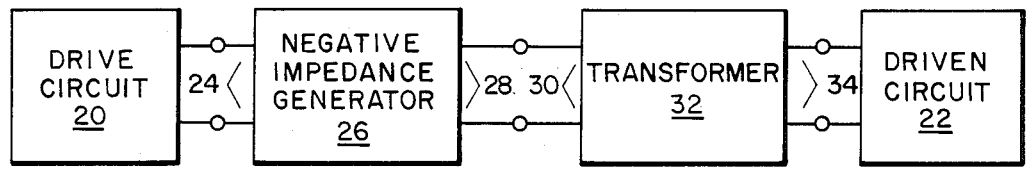
FIG. 2 shows a block diagram of a general embodiment according to the present invention coupling a drive circuit to a driven circuit.

A generalized representation of applicant's invention is shown in FIG. 2 wherein a drive circuit 20 is transformer coupled to a driven circuit 22. The output of the drive circuit 20 is connected to the input port 24 of a negative impedance generator 26. The output port 28 of the negative impedance generator is connected to the input port 30 of the coupling transformer 32, and the output port 34 of the transformer is connected to the input of the driven circuit 22. The negative impedance generator 26 provides an output impedance at output port 28 that is equal in magnitude but opposite in sign to the winding resistance $R_{wp}$ of the transformer. It can be seen from Equation 2 below that by substituting the output impedance of the negative impedance generator, that is, $-R_{wp}$, for source impedance $Z_s$ shown in FIG. 1, the distortion term in Equation 1 drops out.

Equation 2

$$V_{out}(t) = V_{sig}(t) - (-R_{wp} + R_{wp}) I_d(t) = V_{sig}(t)$$

Hence, the distortion that would otherwise be introduced by the transformer is eliminated.

Figure 3:
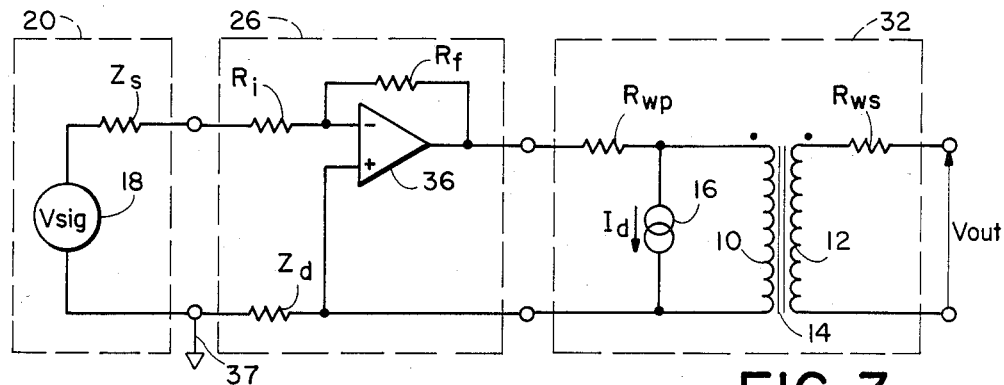
FIG. 3 shows a simplified schematic diagram of a basic embodiment according to the present invention connected to a drive circuit.

A basic circuit implementation of the system shown in FIG. 2 can be understood by reference to FIG. 3. In the embodiment shown in FIG. 3 the negative impedance generator 26 comprises a differential amplifier 36, an input resistor $R_i$, a feedback resistor $R_f$, and detection impedance $Z_d$ for producing a voltage representative of the distortion current $I_d$ generated by the transformer. The signals at the output, non-inverting input, and inverting input of the differential amplifier are all related to a common reference 37. (For ease of explanation it is assumed that $Z_d$ is purely resistive, though it is to be recognized that a reactive component might be included to compensate for reactive effects of the transformer or other circuit components at some frequencies, without departing from the principles of the invention.) It can be shown that the output voltage of the transformer may be expressed by the following equation:

Equation 3

$$V_{out}(t) = -\left(\frac{R_f}{R_i + Z_s}\right) V_{sig}(t) - \left[R_{wp} - \left(\frac{R_f}{R_i + Z_s}\right) Z_d\right] I_d(t)$$

By choosing values for resistors $R_f$ and $R_i$, and impedance $Z_d$ to satisfy the following identity Equation 4

$$R_{wp} = \left(\frac{R_f}{R_i + Z_s}\right) Z_d$$

it can be seen, by substitution, that equation 3 now becomes:

$$V_{out}(t) = -\left(\frac{R_f}{R_i + Z_s}\right) V_{sig}(t) \qquad \text{Equation 5}$$

(The choice of $R_f$ and $R_i$ basically depends upon the gain which one would like to realize from the amplifier, if any.) Thus, the output voltage $V_{out}$ is no longer a function of the distortion current $I_d$. $I_d$ is still present, but the voltage drop that it produces is compensated for by the amplifier, so that $V_{out}$ does not reflect its degrading effect.

Referring again to FIG. 1, it can be shown that the output impedance $Z_{out}$ of the transformer is equal to $R_{ws}+R_{wp}+Z_s$, assuming a 1:1 primary-to-secondary winding ratio. Similarly, the output impedance for the circuit of FIG. 3 can be expressed by the following equation:

$$Z_{out} = R_{ws} + R_{wp} - \left(\frac{R_f}{R_i + Z_s}\right) Z_d \qquad \text{Equation 6}$$

It can be seen from the identity expressed by Equation 4 that under the conditions of applicant's invention, the component of output impedance attributable to the primary winding resistance is cancelled out so that $Z_{out}=R_{ws}$. As a practical matter this means that the output impedance is reduced by one-half for a transformer having a 1:1 winding ratio with similar primary and secondary winding resistances. It is to be understood that other winding ratios could be used without departing from the principles of the invention.

In a practical negative impedance generator circuit according to this invention it is desirable to provide an additional feedback path for the differential amplifier at 36 to provide stability of the DC operating point of the circuit. This is because in the situation where the output impedance of the negative impedance generator exactly equals the primary winding resistance $R_{wp}$, the DC output voltage would be indeterminate, which would allow the amplifier to drift toward one or other of its power supply values, causing the circuit to become inoperative. This problem is solved by providing a feedback circuit from the output of the differential amplifier 36 to the noninverting input, the feedback circuit having a low pass filter characteristic.

Figure 4:
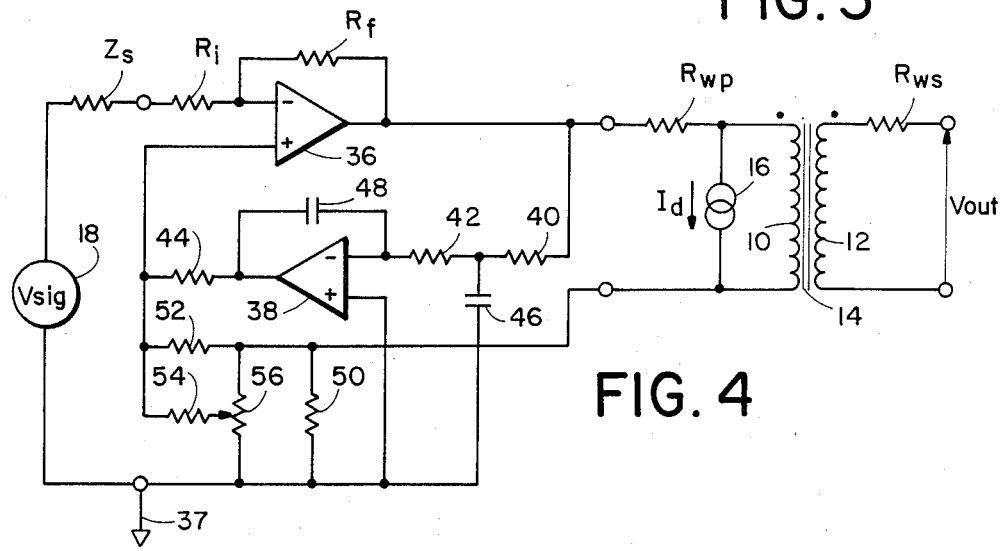
FIG. 4 shows a schematic diagram of an embodiment of the present invention including DC stability and circuit parameter adjustment features, connected to a drive circuit.

In FIG. 4 such a low-frequency feedback circuit is provided by differential amplifier 38, resistors 40, 42, and 44, and capacitors 46 and 48. As is commonly known in the art, resistor 40 and capacitor 46 form a passive low pass filter, and amplifier 38, capacitor 48, and resistor 42 form an active low pass filter, resistor 44 serving to couple the output of differential amplifier 38 to the non-inverting input of differential amplifier 36. Resistor 40 and capacitor 46, and resistor 42 and capacitor 48, respectively, should be chosen in a manner commonly known in the art, to place the high frequency cut-off of this feedback filter at a few hertz so that this feedback signal is essentially DC with respect to the operating bandwidth of the transformer coupling circuit.

Another desirable practical feature of such a circuit is a means for adjusting the magnitude of negative impedance produced by the negative impedance generator to accommodate for uncertainties and tolerances in the primary winding resistance $R_{wp}$, the source impedance $Z_s$, and the values of resistors employed in the negative impedance generator circuit. This can be accomplished preferably by replacing the detection impedance $Z_d$ with three fixed resistors 50, 52, and 54, and one variable resistor 56. It has been found that a satisfactory result can be achieved if the resistances are chosen according to the following equations ("R" denoting the value of the resistor):

$$R_{50} = Z_d\left(1 + \frac{R_{52}}{2 R_{54}}\right) \qquad \text{Equation 7}$$

Equation 8

$$R_{56} = 100\, R_{50}$$

With this network, the amount of negative impedance can be adjusted by varying the variable resistor 56. The range of adjustment may be chosen by varying the ratio of resistor 52 to resistor 54. In general, this circuit is preferable to a mere variable resistor replacement for $Z_d$, as this arrangement tends to increase the stability of the adjustment by decreasing the effect of temperature changes on the actual resistance of a variable resistor. It should be recognized, however, that other adjustment circuits might be employed without departing from the principles of the this invention.

Figure 5:
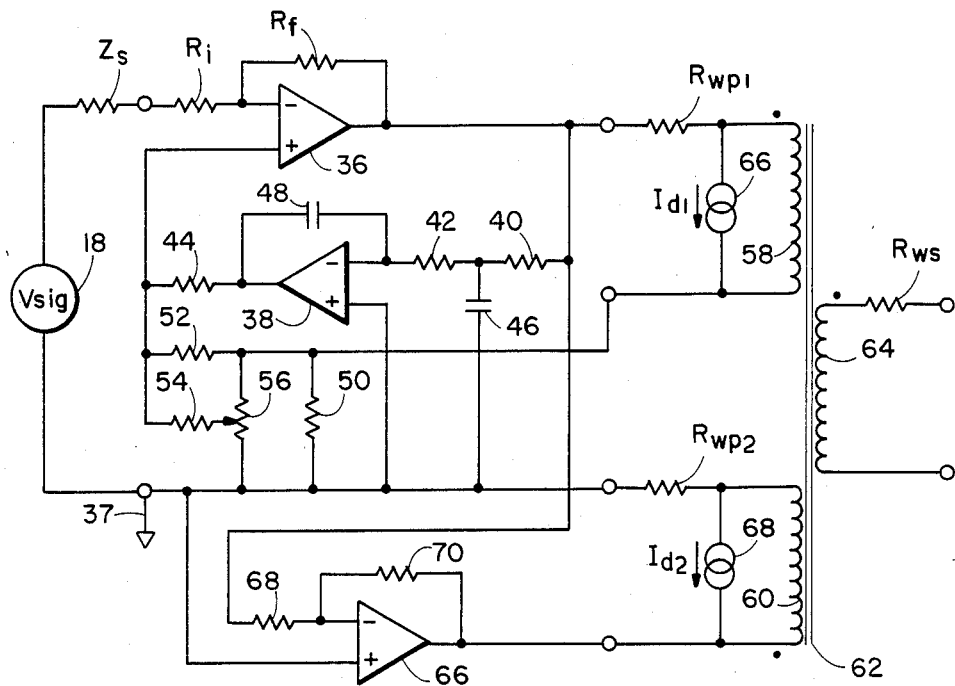
FIG. 5 shows a schematic diagram of an alternative embodiment according to the present invention, coupled to a drive circuit.

An alternative embodiment of the invention is shown in FIG. 5. In this case a transformer is used that has dual matched primary windings. In FIG. 5 the transformer is represented by a first primary winding 58, a second primary winding 60, a magnetic core 62, and a secondary winding 64. The resistance of the first primary winding is represented by resistor $R_{wp1}$ and the distortion current produced by the first primary is represented by current generator 66, generating current $I_{d1}$. Similarly, the resistance of the second primary winding is represented by $R_{wp2}$ and the distortion current is represented by current generator 68, producing distortion current $I_{d2}$. The resistance of the secondary winding is again represented by $R_{ws}$. The negative impedance generator is the same as that shown in FIG. 4 except for the addition of an amplifier to drive the second primary of the transformer. This amplifier comprises differential amplifier 66, its input resistor 68, and its feedback resistor 70, the resistors 68 and 70 being identical so as to provide a drive voltage to the second primary equal in magnitude but opposite in direction of the output of the differential amplifier 36.

Assuming that the two primary windings are essentially identical, their winding resistances will be the same. Consequently, the voltage generated by amplifier 66 will cancel out the distortion voltage produced across $R_{wp2}$ in the second primary. It is only necessary for the amount of distortion current to be detected in the first primary because, since the same flux flows through both the first and second primary windings, both will generate the same distortion current, that is, $I_{d1}=I_{d2}$. The advantage of this configuration is that the use of dual primaries tends to reduce secondary output imbalance at high frequencies.

Figure 6:
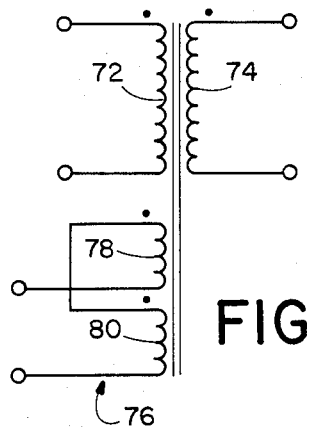
FIG. 6 shows a schematic representation of a magnetic core transformer for use with the present invention for temperature compensation.

Changes in temperature can cause changes in the effective winding resistance of the primary windings of the transformer. This changes the negative impedance required in order to cancel out the effect of that resistance. In general, one way of avoiding this problem is to provide a detection impedance whose temperature coefficient is the same as the temperature coefficient of the primary winding. One way of accomplishing that result would be to wind on the transformer a resistance winding with the same wire used to wind the transformer. As shown in FIG. 6, a transformer may be made having a primary winding 72, a secondary winding 74, and a detector resistance winding 76, having two sections 78 and 80 which are connected in a magnetically null relationship, but whose total resistance is equal to the amount of detector resistance required and which changes resistance with temperature in the same manner as the primary winding resistance. By connecting the two sections in a null sense, the winding 76 is unaffected by the magnetic field generated by the primary or secondary windings, or by the magnetic fields produced by the resistance windings themselves. It is recognized that other methods might be utilized for compensating for temperature coefficients without departing from the principles of this invention.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A circuit for coupling an electrical signal from a drive circuit through a transformer to a driven circuit, comprising:
    (a) a transformer having an input port, an output port for providing an electrical signal to said driven circuit, and an input resistance at said input port; and
    (b) amplifier means, having an input port for receiving an electrical signal from said drive circuit and an output port connected to said input port of said transformer, for producing a negative output resistance at said output port of said amplifier means that is substantially equal in magnitude to said input resistance of said transformer.

2. The circuit of claim 1 wherein said transformer has a first primary winding having a first transformer input connection and a second transformer input connection which together form said input port, and said amplifier means comprises a first differential amplifier having output, non-inverting input, and inverting input connections, said amplifier output connection being connected to said first transformer input connection and said non-inverting input connection being connected to said second transformer input connection, a selected detection impedance element connected between said non-inverting input connection and a reference, a feedback impedance element connected between said amplifier output connection and said inverting input connection, and an input impedance element connected at one end to said inverting input connection, the other end of said input impedance element and said reference forming said amplifier input port, said feedback impedance element and input impedance element being chosen so that the resultant gain of said differential amplifier times the value of the detection impedance element is equal to the resistance of the transformer primary winding.

3. The circuit of claim 2 wherein said input impedance element is chosen so that the required gain is equal to the ratio of said feedback impedance to the sum of the input impedance and the source impedance of a selected drive circuit connected to the input port of said amplifier means.

4. The circuit of claim 2 wherein said detection impedance element includes means for adjusting the impedance thereof.

5. The circuit of claim 2 wherein said detection impedance element has the same temperature-resistance coefficient as said primary winding of said transformer.

6. The circuit of claim 5 wherein said detection impedance element comprises a wire-wound resistor made of wire the same as the wire of the primary winding of said transformer.

7. The circuit of claim 2 further comprising a feedback circuit connected between said amplifier output connection and an input connection of said amplifier, said feedback circuit comprising a low-pass filter.

8. The circuit of claim 7 wherein said low-pass filter comprises a passive resistor-capacitor low-pass filter followed by an integrator.

9. The circuit of claim 2 wherein said transformer has a second primary winding having a first input connection and a second input connection, and said amplifier means further comprises a second differential amplifier means, having output, non-inverting input, and inverting input connections, an input resistor connected from said output of said first differential amplifier to said inverting input of said second differential amplifier, and a feedback resistor connected from the output of said second differential amplifier to the inverting input thereof, said non-inverting input of said second differential amplifier and said first input connection of said second primary winding being connected to said reference, and the output of said second differential amplifier being connected to said second input connection of said second primary winding, the first input connection of said second primary winding corresponding in polarity to the first input connection of said first primary winding.

10. A method for coupling an electrical signal from a drive circuit through a transformer to a driven circuit, the transformer having at least one primary winding and a secondary winding, the method comprising:
    (a) providing to an inverting input of a differential amplifier having a predetermined gain said electrical signal from said drive circuit;
    (b) providing to said primary winding the output from said differential amplifier;
    (c) providing to said driven circuit the output from said secondary winding; and
    (d) providing to a non-inverting input of said differential amplifier a signal representative of the current through said primary winding of said transformer.

11. The method of claim 10, further comprising providing to the non-inverting input of said differential amplifier a portion of the output of said differential amplifier having frequency components lower than a predetermined frequency.

12. The method of claim 10 wherein said transformer includes a second primary winding, said method further comprising supplying to said second primary winding a signal substantially identical to the output from said differential amplifier.

13. The method of claim 10 wherein said signal representative of the current through said primary winding is obtained by applying to said non-inverting input the voltage across an impedance in series with said primary winding, the impedance having the same temperature-resistance coefficient as said primary winding.

* * * * *